(12) United States Patent
Adachi

(10) Patent No.: US 8,008,840 B2
(45) Date of Patent: Aug. 30, 2011

(54) DRIVE UNIT

(75) Inventor: Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/794,056

(22) Filed: Jun. 4, 2010

(65) Prior Publication Data

US 2010/0244627 A1    Sep. 30, 2010

Related U.S. Application Data

(63) Continuation of application No. PCT/JP2008/003628, filed on Dec. 5, 2008.

(30) Foreign Application Priority Data

Dec. 7, 2007   (JP) .................................. 2007-316907

(51) Int. Cl.
*H01L 41/04* (2006.01)
*H02N 2/04* (2006.01)

(52) U.S. Cl. .............................. 310/323.01; 310/323.16

(58) Field of Classification Search . 310/323.01–323.21
See application file for complete search history.

(56) References Cited

U.S. PATENT DOCUMENTS

| | | | |
|---|---|---|---|
| 5,821,667 A | | 10/1998 | Takagi et al. |
| 7,211,929 B2 * | | 5/2007 | Ganor et al. ................. 310/317 |
| 2006/0250048 A1 * | | 11/2006 | Moteki et al. ............ 310/323.02 |
| 2008/0093953 A1 * | | 4/2008 | Koc et al. ................. 310/323.02 |
| 2009/0021114 A1 | | 1/2009 | Adachi |
| 2009/0026884 A1 * | | 1/2009 | Adachi et al. ............ 310/323.16 |
| 2009/0072665 A1 * | | 3/2009 | Adachi et al. ............ 310/323.16 |
| 2009/0091213 A1 | | 4/2009 | Adachi |

FOREIGN PATENT DOCUMENTS

| | | |
|---|---|---|
| JP | 7-264882 | 10/1995 |
| JP | 09-224385 | 8/1997 |
| JP | 2001-268953 | 9/2001 |
| JP | 2007-276180 | 10/2007 |
| JP | 2007-300798 | 11/2007 |
| JP | 2007-306800 | 11/2007 |
| WO | WO 2007/066633 * | 6/2007 |
| WO | WO 2007/069682 * | 6/2007 |

OTHER PUBLICATIONS

International Search Report for corresponding International Application No. PCT/JP2008/003628 mailed Feb. 24, 2009.
Form PCT/ISA/237 for International Application No. PCT/JP2008/003628 dated Feb. 24, 2009.

* cited by examiner

*Primary Examiner* — Derek Rosenau
(74) *Attorney, Agent, or Firm* — Renner, Otto, Boisselle & Sklar, LLP

(57) ABSTRACT

A drive unit which generates less heat may be provided. The drive unit includes a piezoelectric element (P1) having a piezoelectric layer (1), a drive power supply (14) configured to apply a driving voltage at a predetermined frequency to the piezoelectric element (P1) such that vibration including stretching vibration and bending vibration is generated in the piezoelectric element (P1), and a movable element (9) which is movable relative to the piezoelectric element (P1) according to the vibration of the piezoelectric element (P1). The difference between the resonance frequency of the bending vibration of the piezoelectric element (P1) and the anti-resonance frequency of the stretching vibration of the piezoelectric element (P1) is smaller than the difference between the resonance frequency of the bending vibration of the piezoelectric element (P1) and the resonance frequency of the stretching vibration of the piezoelectric element (P1).

17 Claims, 12 Drawing Sheets

DRIVE UNIT

CROSS-REFERENCE TO RELATED APPLICATIONS

This application is a continuation of PCT International Patent Application No. PCT/JP2008/003628 filed on Dec. 5, 2008, which claims priority of Japanese Patent Application No. 2007-316907 filed on Dec. 7, 2007, the entire contents of which are expressly incorporated by reference herein.

BACKGROUND

The present invention relates to a drive unit which includes a vibrator with a piezoelectric body.

Conventionally, an ultrasonic actuator is known as a driving device which includes a piezoelectric element (electromechanical conversion element) for use in various electric devices and other types of devices (e.g., Patent Document 1).

An ultrasonic motor drive unit described in Patent Document 1 at least includes an ultrasonic vibrator which excites the first vibration mode and the second vibration mode, a slider plate actuated by this ultrasonic vibrator, a pressing member which presses the ultrasonic vibrator against the slider plate, and power supply means for applying an alternating voltage to an electromechanical converter included in the ultrasonic vibrator. In the state where the ultrasonic vibrator is pressed against the slider plate with a predetermined force, the resonance frequency of the first vibration mode in which vibration occurs in a direction perpendicular to the direction of movement of the slider plate is lower than the resonance frequency of the second vibration mode in which vibration occurs in the direction of movement of the slider plate. The ultrasonic vibrator is actuated at a frequency between the resonance frequency of the first vibration mode and the resonance frequency of the second vibration mode.
Patent Document 1: Japanese Laid-Open Patent Publication No. 9-224385

SUMMARY

The ultrasonic motor drive unit described in Patent Document 1 uses the second-order bending vibration as the first vibration mode and the first-order stretching vibration as the second vibration mode. The motor is driven within a range including the resonance frequency of the stretching vibration. In general, the impedance of a piezoelectric body in the stretching vibration is lower than in the bending vibration. Therefore, near the resonance frequency of the stretching vibration, there is a probability that the impedance is low, and a large current flows, so that the element generates heat.

An object of the present invention may be to provide a drive unit in which a driver element generates less heat.

The present invention is directed to a drive unit which includes a vibrator with a piezoelectric body, a drive power supply for applying a driving voltage at a predetermined frequency to the vibrator such that vibration including stretching vibration and bending vibration is generated in the vibrator, a relatively movable element which is movable relative to the vibrator according to the vibration of the vibrator. The difference between the resonance frequency of the bending vibration of the vibrator and the anti-resonance frequency of the stretching vibration of the vibrator is smaller than the difference between the resonance frequency of the bending vibration of the vibrator and the resonance frequency of the stretching vibration of the vibrator.

The present invention may advantageously provide a drive unit in which an element generates less heat.

DESCRIPTION OF REFERENCE CHARACTERS

Figure 1:
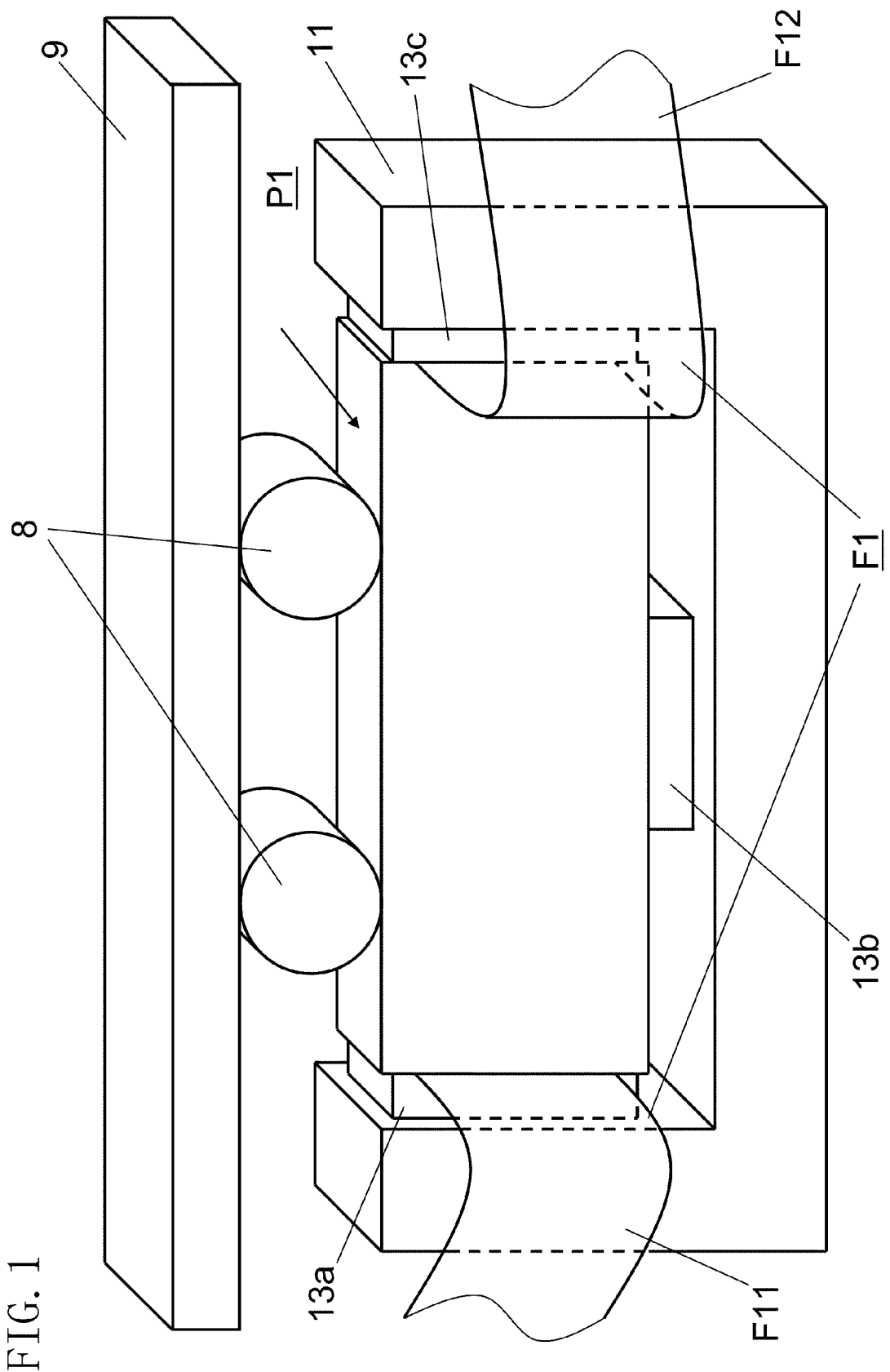
FIG. 1 is a general perspective view of an ultrasonic actuator according to an embodiment.

P1 piezoelectric element
F1 flexible cable (electrical connection members)
F11 first flexible cable (first electrical connection member)
F12 second flexible cable (second electrical connection member)
1 piezoelectric layer
2 power supply electrode
2A first power supply electrode
2B second power supply electrode
$2a$ first power supply lead electrode
$2b$ second power supply lead electrode
3 counter electrode
$3g$ counter lead electrode
4 power supply external electrode
4A first power supply external electrode
4B second power supply external electrode
5 counter external electrode
6 electric line (power supply conductive member)
6A electric line (first power supply conductive member)
6B electric line (second power supply conductive member)
7 electric line (counter conductive member)
8 driver element
9 movable element (relatively movable element)
J1 first connection electrode
J2 second connection electrode
10A first connection external electrode
10B second connection external electrode
11 case
$13a$, $13b$, $13c$ supporting portion
14 drive power supply

DETAILED DESCRIPTION

Hereinafter, embodiments of the present invention are described in detail with reference to the drawings.

FIG. 1 is a general perspective view of a drive unit according to an embodiment. The drive unit of this embodiment includes an ultrasonic actuator, a movable element 9 which is driven in a predetermined movable direction by the ultrasonic actuator, and a drive power supply 14 for controlling the ultrasonic actuator (see FIG. 8).

<<1: Structure of Ultrasonic Actuator>>

<1.1: General Configuration>

The ultrasonic actuator of this embodiment includes a piezoelectric element P1, driver elements 8 provided to the piezoelectric element P1, a case 11 containing the piezoelectric element P1, supporting portions 13a-13c supporting the piezoelectric element P1 on the case 11, and first and second flexible cables F11 and F12 for powering the piezoelectric element P1. Generation of stretching vibration and bending vibration in the piezoelectric element P1 causes generation of relative driving force between the piezoelectric element P1 and the movable element 9.

As shown in FIG. 1, the ultrasonic actuator includes the piezoelectric element P1 which is in the shape of a generally rectangular parallelepiped (for example, length 6.0 mm×width 1.7 mm×thickness 2.0 mm). The piezoelectric element P1 includes piezoelectric layers and electrode layers which are stacked in the direction perpendicular to the plane of FIG. 1. In FIG. 1, the anterior surface of the piezoelectric element P1 in the drawing sheet is a principal surface of the piezoelectric layer 1. Hereinafter, a pair of opposite principal surfaces of the piezoelectric layer are referred to as "principal surfaces". A pair of opposite surfaces which are perpendicular to the principal surfaces and which are parallel to the long sides of the principal surfaces are referred to as "long-side surfaces". A pair of opposite surfaces which are perpendicular to the principal surfaces and which are parallel to the short sides of the principal surfaces are referred to as "short-side surfaces". The principal surfaces, the long-side surfaces and the short-side surfaces constitute the outer surfaces of the piezoelectric element P1. The long-side surfaces and the short-side surfaces constitute the circumferential surfaces of the piezoelectric element P1. In this embodiment, among the principal surfaces, the long-side surfaces and the short-side surfaces, the principal surfaces have the largest area. In this embodiment, the piezoelectric element P1 forms a vibrator.

The piezoelectric element P1 is contained in the case 11 which is a supporting body. The piezoelectric element P1 is supported on the case 11 via three supporting portions 13a, 13b and 13c. All of the three supporting portions 13a, 13b and 13c are elastic. The supporting portions 13a and 13c are compressed in the gaps between the two short-side surfaces and the case 11. In this way, the piezoelectric element P1 is supported by the supporting portions 13a and 13c in the long-side direction of the principal surface.

The two short-side surfaces of the piezoelectric element P1 are electrically connected to electrical connection members.

One of the long-side surfaces of the piezoelectric element P1 is provided with the driver elements 8, and the driver elements 8 are in contact with the movable element 9 which is in the shape of a flat plate. Specifically, the driver elements 8 are fixed to part of the piezoelectric element P1 near the antinode of the second mode bending vibration, which will be described later. The driver elements 8 are in the shape of a circular pole and are in line contact with the piezoelectric element P1. The driver elements 8 and the piezoelectric element P1 are fixed together by an adhesive. The adhesive used is softer than the piezoelectric layer 1 and the driver elements 8. The softness can be compared by, for example, the modulus of elasticity. The driver elements 8 and part of the movable element 9 which is in contact with the driver elements 8 are formed of a ceramic material containing, e.g., zirconia, alumina, silicon nitride as main constituents, or a resin material.

The supporting portion 13b is provided between the other long-side surface of the piezoelectric element P1, i.e., a long-side surface opposite to the long-side surface on which the driver elements 8 are provided, and the case 11. The supporting portion 13b is compressed along a direction toward the movable element 9 (the lateral direction of the piezoelectric element P1). The supporting portion 13b pushes the piezoelectric element P1 against the movable element 9 due to its reaction force. This increases the frictional force between the tips of the driver elements 8 and the movable element 9 so that the driving force produced by the vibration of the piezoelectric element P1 is effectively transmitted to the movable element 9 via the driver elements 8.

<1.2: Piezoelectric Element P1>

The piezoelectric element P1 of this embodiment is in the shape of a generally rectangular parallelepiped. The piezoelectric element P1 includes a plurality of generally rectangular piezoelectric layers 1, which are piezoelectric, and internal electrode layers interposed between the piezoelectric layers 1. The piezoelectric element P1 is configured in such a manner that the piezoelectric layers and the electrode layers are stacked in a direction from front to back of the drawing sheet of FIG. 1 (hereinafter, sometimes referred to as thickness direction).

Figure 2:
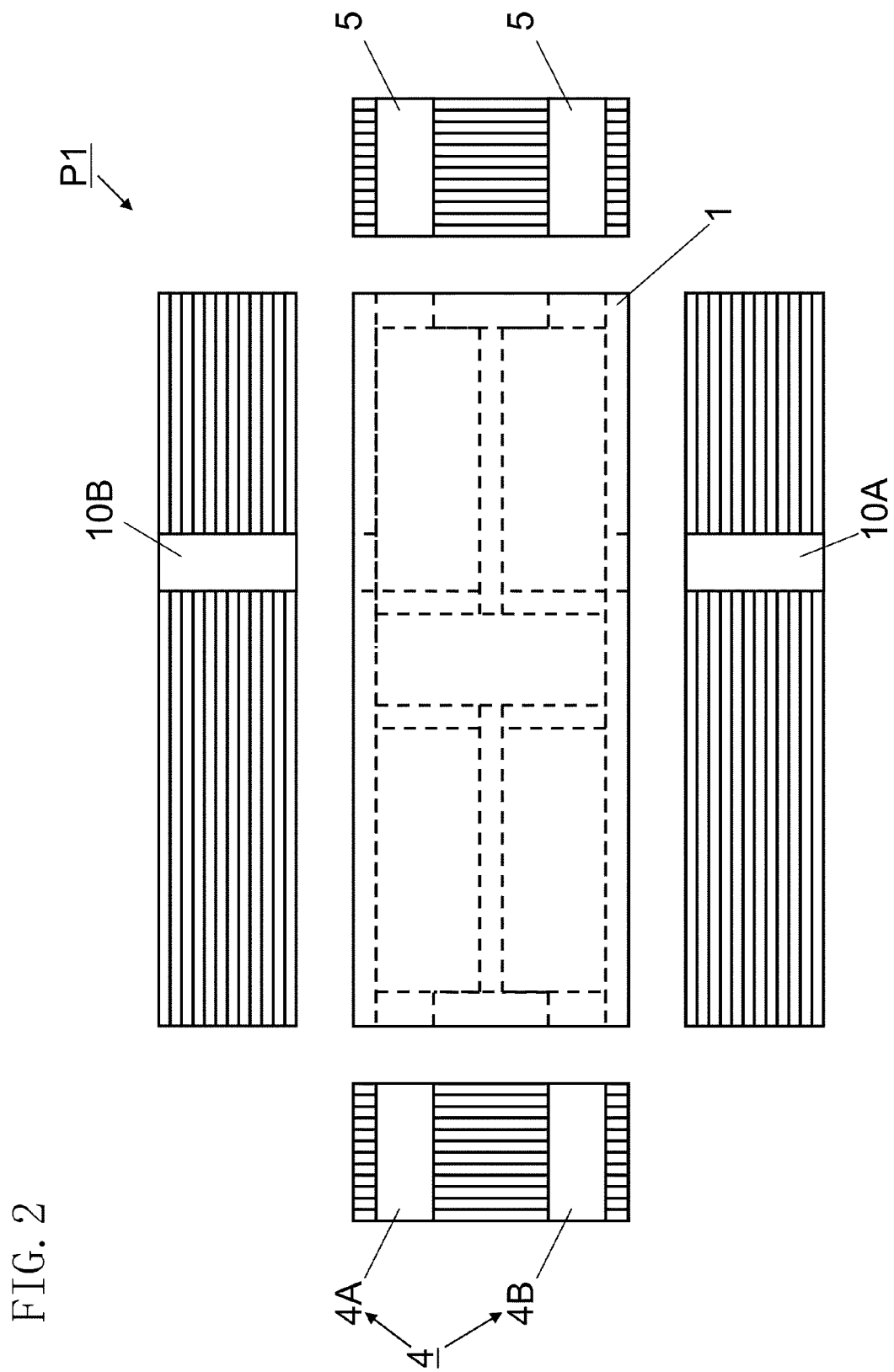
FIG. 2 is an orthographic developed view of a piezoelectric element of the embodiment.
Figure 3:
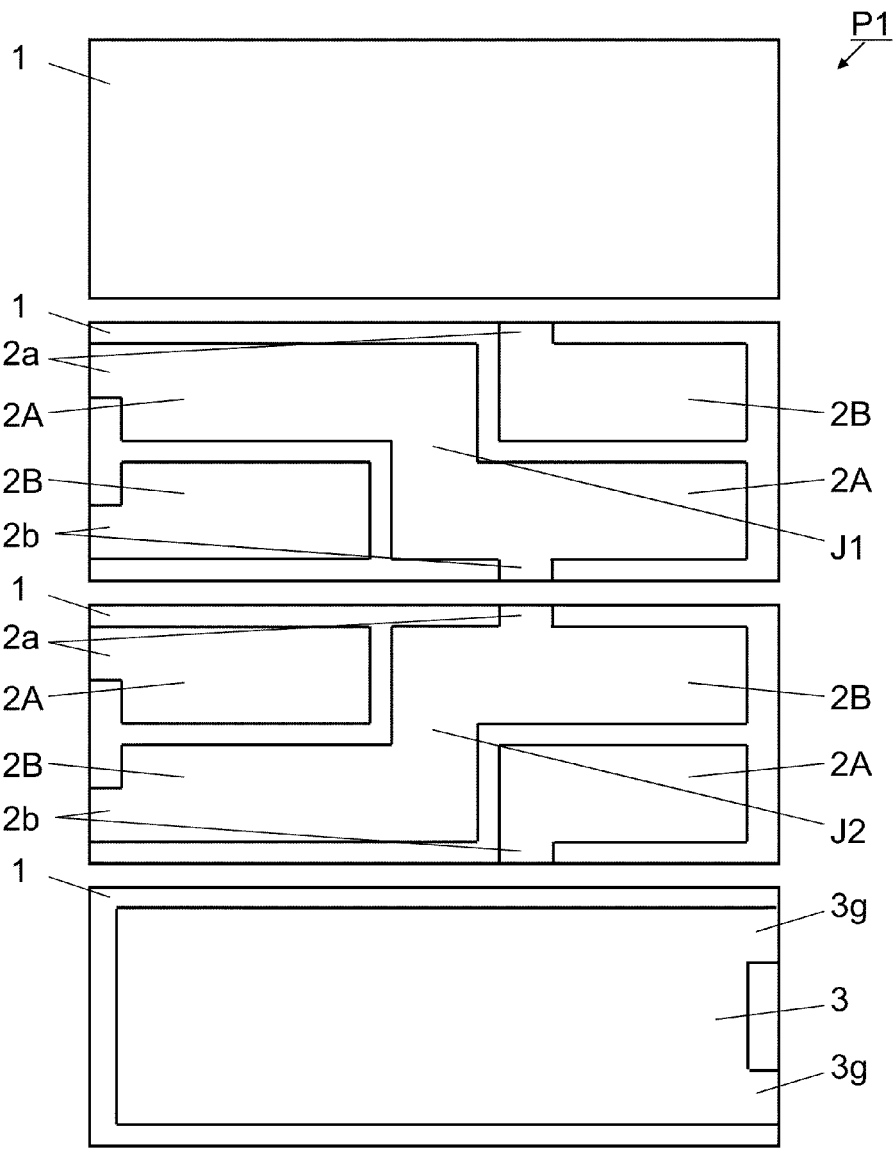
FIG. 3 shows the layers of the piezoelectric element of the embodiment which are seen in the layer stacking direction.

FIG. 2 is an orthographic developed view of the piezoelectric element P1 of this embodiment. In FIG. 2, a portion shown at the center represents the principal surface, portions shown on the right and left sides of the principal surface are the short-side surfaces, and portions shown on the upper and lower sides of the principal surface are the long-side surfaces. The internal electrode layers are located behind the principal surface, and thus cannot be seen. The positions of the internal electrode layers projected over the principal surface are represented by broken lines. FIG. 3 shows the respective layers of the piezoelectric element P1 of this embodiment which are seen in the stacking direction.

As shown in FIG. 2, the piezoelectric element P1 is in the shape of a generally rectangular parallelepiped, which is formed by alternately stacking the generally rectangular piezoelectric layers 1 and the internal electrode layers. The piezoelectric layer 1 is an insulation layer formed of, for example, a ceramic material, such as lead zirconate titanate. The internal electrode layers are formed of power supply electrodes 2 and counter electrodes 3 which are alternately provided in the stacking direction (thickness direction of the piezoelectric element P1) with the piezoelectric layers 1 interposed therebetween. The internal electrode layers are electrode layers which are formed of a metal containing, for example, silver and palladium as main constituents and which are provided on the principal surface of the piezoelectric layer 1.

As shown in FIG. 2, power supply external electrodes 4 and counter external electrodes 5 are provided on the short-side surfaces of the piezoelectric element P1. Specifically, the power supply external electrodes 4 include a first power supply external electrode 4A and a second power supply external electrode 4B which are mutually separate. The first power supply external electrode 4A and the second power supply external electrode 4B are provided on one of the two short-side surfaces of the piezoelectric element P1. The piezoelectric element P1 includes the two counter external electrodes 5 which are provided on the other one of the two short-side surfaces. These electrodes 4A, 4B and 5 are mutually insulated. In other words, the electrodes 4A, 4B and 5 are not electrically coupled to one another. One of the long-side surfaces of the piezoelectric element P1 is provided with a first connection external electrode 10A, and the other long-side surface is provided with a second connection external electrode 10B. The first connection external electrode 10A and the second connection external electrode 10B are mutually insulated.

The power supply electrodes 2 are provided on the principal surface of at least one of the plurality of piezoelectric layers 1 as shown in FIG. 3(B) and FIG. 3(C). Specifically, the power supply electrodes 2 are provided on the principal surface of at least one of the plurality of piezoelectric layers 1 in the first pattern as shown in FIG. 3(B). On the principal surface of another one of the plurality of piezoelectric layers 1 different from the piezoelectric layer 1 on which the power supply electrodes 2 are provided in the first pattern, the power supply electrodes 2 are provided in the second pattern as shown in FIG. 3(C) which is different from the first pattern.

Specifically, each of the power supply electrodes 2 formed in the first pattern and the power supply electrodes 2 formed in the second pattern includes first power supply electrodes 2A and second power supply electrodes 2B which are not electrically coupled to the first power supply electrodes 2A.

Figure 4:
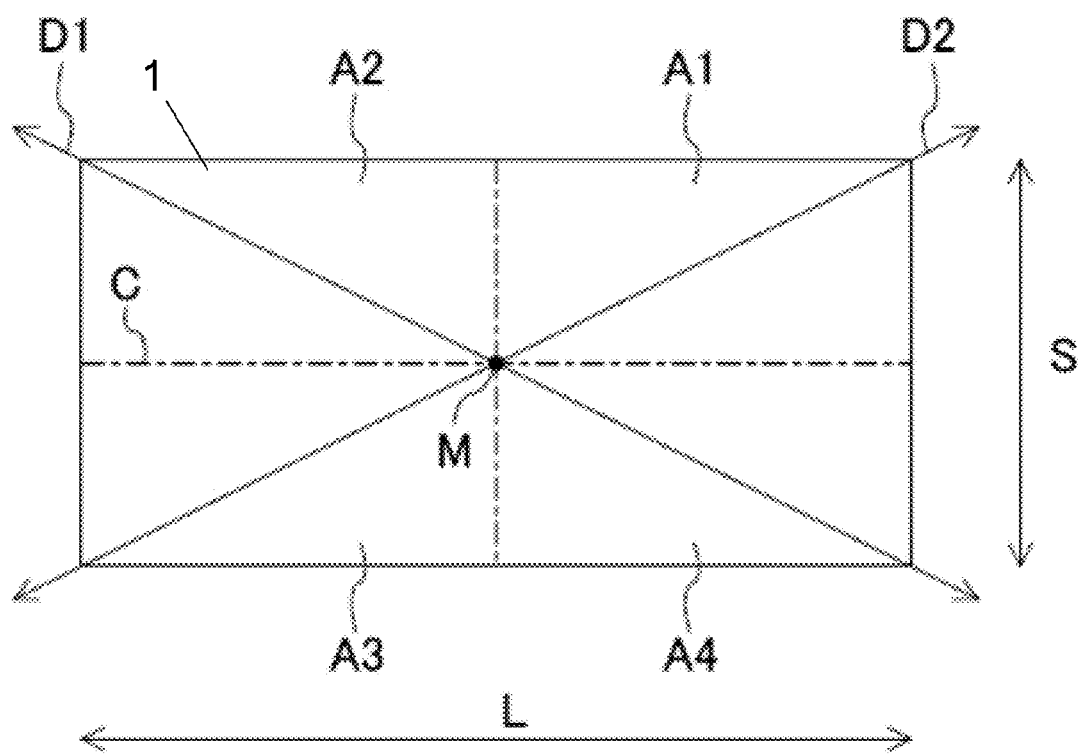
FIG. 4 illustrates the four regions over a principal surface of a piezoelectric layer.

In each of the first and second patterns, among four divisional regions A1-A4 (see FIG. 4) of the principal surface of the piezoelectric layer 1 which are defined by halving the principal surface with respect to both longitudinal direction L and lateral direction S, the first power supply electrodes 2A are provided in two of the four divisional regions A1-A4 which are aligned in the first diagonal direction D1 of the principal surface of the piezoelectric layer 1, i.e., in the divisional regions A2 and A4. The second power supply electrodes 2B are provided in the other two of the four divisional regions A1-A4 which are aligned in the second diagonal direction D2 of the principal surface of the piezoelectric layer 1, i.e., in the divisional regions A1 and A3.

The first pattern power supply electrodes 2 include a first connection electrode J1 extending in the lateral direction at the longitudinal center of the principal surface of the piezoelectric layer 1. The first power supply electrodes 2A provided in the two divisional regions A2 and A4 of the first pattern are mutually coupled via the first connection electrode J1. The second pattern power supply electrodes 2 include a second connection electrode J2 extending in the lateral direction at the longitudinal center of the principal surface of the piezoelectric layer 1. The second power supply electrodes 2B provided in the two divisional regions A1 and A3 of the second pattern are mutually coupled via the second connection electrode J2.

In each of the first and second patterns, among the first power supply electrodes 2A provided in the two divisional regions A2 and A4, the first power supply electrode 2A provided in the divisional region A2 which is closer to the short-side surface that has the first power supply external electrode 4A thereon includes a first power supply lead electrode 2a extending to the first power supply external electrode 4A. In this way, the first power supply electrode 2A of the divisional region A2 is electrically coupled to the first power supply external electrode 4A via the first power supply lead electrode 2a. Among the first power supply electrodes 2A provided in the two divisional regions A2 and A4, the first power supply electrode 2A provided in the divisional region A4 which is more distant from the short-side surface that has the first power supply external electrode 4A thereon includes a first power supply lead electrode 2a extending to the first connection external electrode 10A provided on the long-side surface. In this way, the first power supply electrodes 2A of the divisional region A4 in the different piezoelectric layers 1 are electrically coupled to each other via the first connection external electrode 10A. Since in the first pattern, the first power supply electrode 2A of the divisional region A4 is electrically coupled to the first power supply electrode 2A of the divisional region A2 via the first connection electrode J1, the first power supply electrode 2A of the divisional region A4 of the second pattern, which is electrically coupled to the first power supply electrode 2A of the divisional region A4 of the first pattern via the first connection external electrode 10A, is electrically coupled to the first power supply external electrode 4A of the first pattern via the first connection electrode J1.

In each of the first and second patterns, among the second power supply electrodes 2B provided in the two divisional regions A1 and A3, the second power supply electrode 2B provided in the divisional region A3 which is closer to the short-side surface that has the second power supply external electrode 4B thereon includes a second power supply lead electrode 2b extending to the second power supply external electrode 4B. In this way, the second power supply electrode 2B of the divisional region A3 is electrically coupled to the second power supply external electrode 4B via the second power supply lead electrode 2b. Among the second power supply electrodes 2B provided in the two divisional regions A1 and A3, the second power supply electrode 2B provided in the divisional region A1 which is more distant from the short-side surface that has the second power supply external electrode 4B thereon includes a second power supply lead electrode 2b extending to the second connection external electrode 10B provided on the long-side surface. In this way, the second power supply electrodes 2B of the divisional region A1 in the different piezoelectric layers 1 are electrically coupled to each other via the second connection external electrode 10B. Since in the second pattern the second power supply electrode 2B of the divisional region A1 is electrically coupled to the second power supply electrode 2B of the divisional region A3 via the second connection electrode J2, the second power supply electrode 2B of the divisional region A1 of the first pattern, which is electrically coupled to the second power supply electrode 2B of the divisional region A1 of the second pattern via the second connection external electrode 10B, is electrically coupled to the second power supply external electrode 4B via the second connection electrode J2 of the second pattern.

The counter electrode 3 is provided over substantially the entire principal surface of the piezoelectric layer 1 as shown in FIG. 3(D). Specifically, the counter electrode 3 is not provided in a circumferential region of the principal surface of the piezoelectric layer 1 but is provided over substantially the entirety of a region inside the circumferential region. The counter electrode 3 includes counter lead electrodes 3g which extend from both ends of a short-side near the short-side surface that has the counter external electrodes 5 thereon toward the counter external electrodes 5 so as to be connected to the counter external electrodes 5. In this way, the counter electrode 3 is electrically coupled to the counter external electrodes 5 via the counter lead electrodes 3g. The counter electrodes 3 provided on different piezoelectric layers 1 are electrically coupled to each other via the counter lead electrodes 3g and the counter external electrodes 5.

The piezoelectric element P1 is formed by stacking the piezoelectric layers 1 provided with the power supply electrodes 2 or the counter electrode 3 on the principal surfaces as described above. Specifically, the plurality of piezoelectric layers 1 are sequentially stacked in the order of the piezoelectric layer 1 provided with the first pattern power supply electrodes 2, the piezoelectric layer 1 provided with the counter electrode 3, the piezoelectric layer 1 provided with the second pattern power supply electrodes 2, the piezoelectric layer 1 provided with the counter electrode 3, the piezoelectric layer 1 provided with the first pattern power supply electrodes 2, the piezoelectric layer 1 provided with the counter electrode 3, . . . . The piezoelectric layers 1 are stacked such that the principal surfaces provided with the power supply electrodes 2 or the counter electrode 3 are oriented in the same direction, i.e., such that the principal surface of one of the piezoelectric layers 1 on which the power supply electrodes 2 or the counter electrode 3 is provided faces the principal surface of another one of the piezoelectric layers 1 on which none of the power supply electrodes 2 and the counter electrode 3 is provided. Note that, the first and/or last of the stacked layers are the piezoelectric layers 1 which are not provided with the power supply electrodes 2 or the counter electrode 3 such that the power supply electrodes 2 or the counter electrode 3 would not be exposed.

As a result of stacking the piezoelectric layers 1, the power supply electrodes 2 and the counter electrode 3, each of the piezoelectric layers 1 is sandwiched by the power supply electrodes 2 (specifically, the first power supply electrode 2A and the second power supply electrode 2B) and the counter electrode 3. Thus, when seen in the stacking direction, the power supply electrodes 2 and the counter electrode 3 are overlapping with each other with the piezoelectric layer 1 interposed therebetween. Here, each of the piezoelectric layers 1 is polarized from the power supply electrode 2 side to the counter electrode 3 side.

Note that the piezoelectric layers 1 include a region in which the power supply electrodes 2 and the counter electrode 3 are not overlapping when seen in the stacking direction (see FIG. 2). For example, the first power supply lead electrode 2a, the second power supply lead electrode 2b, and the counter lead electrodes 3g are not overlapping with the counter electrode 3 or the power supply electrodes 2 when seen in the stacking direction. In part of the piezoelectric layers 1 corresponding to the non-overlapping region, no electric field occurs. In other words, this part of the piezoelectric layers 1 is piezoelectrically inactive. Specifically, in part of the piezoelectric layer 1 near the short-side surfaces, the power supply electrodes 2 and the counter electrode 3 are not overlapping when seen in the stacking direction. This part of the piezoelectric layers 1 is piezoelectrically inactive.

<1.3: Electrical Connection Member>

In this embodiment, flexible cables F1 are used as the electrical connection member. The flexible cables F1 include a first flexible cable F11 and a second flexible cable F12. As shown in FIG. 1, the first flexible cable F11 and the second flexible cable F12 are electrically connected to the piezoelectric element P1 at the respective short-side surfaces of the piezoelectric element P1. The first flexible cable F11 and the second flexible cable F12 have the same shape.

Figure 5:
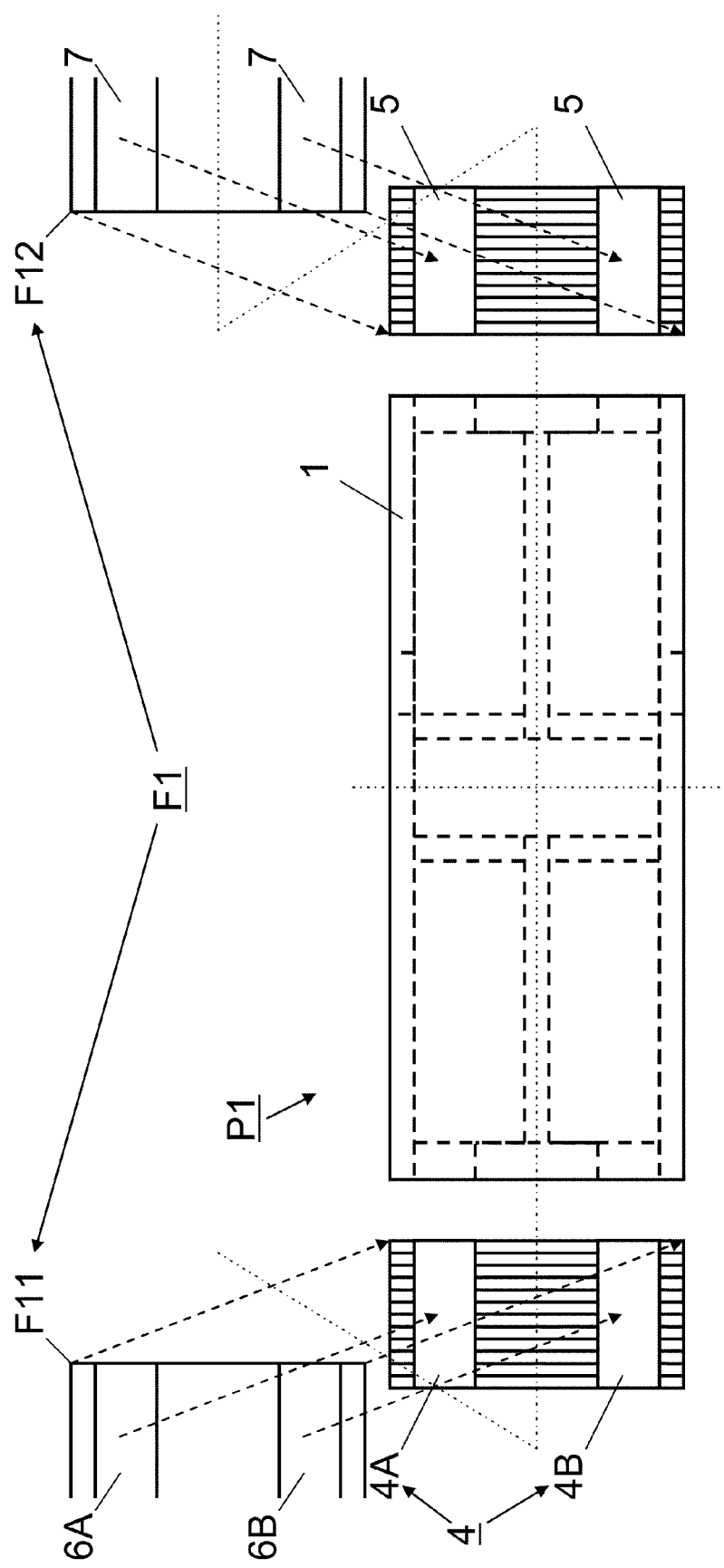
FIG. 5 shows the positional relationship for connection of flexible cables and short-side surfaces of the piezoelectric element.

FIG. 5 shows the positional relationship in connection between the first and second flexible cables F11 and F12 and the lateral surfaces of the piezoelectric element P1. As shown in FIG. 5, the first and second flexible cables F11 and F12 include a plurality of electric wires formed by printing copper over an insulative resin substrate. The electric wires are mutually insulated.

The first flexible cable F11 is connected to one of the short-side surfaces of the piezoelectric element P1. The first flexible cable F11 has electric lines 6 which are connected to the power supply external electrodes 4. Specifically, the first flexible cable F11 has an electric line 6A connected to the first power supply external electrode 4A and an electric line 6B connected to the second power supply external electrode 4B.

The second flexible cable F12 is connected to the other one of the short-side surfaces of the piezoelectric element P1. The second flexible cable F12 has electric lines 7 which are connected to the counter external electrodes 5. Specifically, the second flexible cable F12 has electric lines 7 connected to the counter external electrodes 5.

The first flexible cable F11 has a shape symmetrical about a plane which passes through the midpoints of the short sides of the principal plane of the piezoelectric layer 1 and which is parallel to the long-side surfaces. The second flexible cable F12 also has a shape symmetrical about the plane which passes through the midpoints of the short sides of the principal plane of the piezoelectric layer 1 and which is parallel to the long-side surfaces as does the first flexible cable F11. The first flexible cable F11 and the second flexible cable F12 have a shape symmetrical about a plane which passes through the midpoints of the long sides of the principal plane of the piezoelectric layer 1 and which is parallel to the short-side surface.

Thus, a connecting portion of the first flexible cable F11 which is connected to the piezoelectric element P1 has a shape symmetrical about the plane which passes through the midpoints of the short sides of the principal plane of the piezoelectric layer 1 and which is parallel to the long-side surfaces. Also, a connecting portion of the second flexible cable F12 which is connected to the piezoelectric element P1 has a shape symmetrical about the plane which passes through the midpoints of the short sides of the principal plane of the piezoelectric layer 1 and which is parallel to the long-side surfaces. The connecting portion of the first flexible cable F11 which is connected to the piezoelectric element P1, and the connecting portion of the second flexible cable F12 which is connected to the piezoelectric element P1 have a shape symmetrical about the plane which passes through the midpoints of the long sides of the principal plane of the piezoelectric layer 1 and which is parallel to the short-side surface.

In the connecting portions of the first and second flexible cables F11 and F12, and a connecting portion of the piezoelectric element P1, these elements are electrically connected and adhered using an anisotropic conductive adhesion sheet, respectively. The anisotropic conductive adhesion sheet is prepared by molding a resin containing electrically conductive particles dispersed therein into the form of a sheet. The anisotropic conductive adhesion sheet has an electric conductivity in the adhesion direction, i.e., in the sheet thickness direction, but lacks electric conductivity in the in-plane directions of the adhesion surface. Therefore, the plurality of electrodes provided over the short-side surfaces of the piezoelectric element P1 can be electrically coupled to the respective electric lines of the first and second flexible cables F11 and F12 by a single anisotropic conductive adhesion sheet with the electrodes being mutually insulated. In the first step of the connection method, an anisotropic conductive sheet is sandwiched between the first and second flexible cables F11 and F12 made of polyimide and the piezoelectric element P1. Then, the first and second flexible cables F11 and F12 are pressed against the piezoelectric element P1 using a heated flat iron. As a result, the first and second flexible cables F11 and F12 and the piezoelectric element P1 are electrically coupled by the electrically conductive particles and adhered by the effect of the resin of the anisotropic conductive adhesion sheet.

The connection portions of the first and second flexible cables F11 and F12 and the piezoelectric element P1 are respectively interposed between the supporting portion 13a and the piezoelectric element P1 and between the supporting portion 13c and the piezoelectric element P1. Specifically, the first flexible cable F11 is pressed by the supporting portion 13a against the piezoelectric element P1. The second flexible cable F12 is pressed by the supporting portion 13c against the piezoelectric element P1.

The electric lines 6 connected to the power supply external electrodes 4 are an example of the power supply conductive member. The electric line 6A connected to the first power supply external electrode 4A is an example of the first power supply conductive member. The electric line 6B connected to the second power supply external electrode 4B is an example of the second power supply conductive member. The electric lines 7 connected to the counter external electrodes 5 are an example of the counter conductive member. The first flexible cable F11 is an example of the first electrical connection member. The second flexible cable F12 is an example of the second electrical connection member.

The first and second flexible cables F11 and F12 are coupled to the drive power supply 14. A driving voltage from the drive power supply 14 is applied to the piezoelectric element P1 via the first and second flexible cables F11 and F12 such that vibration including stretching vibration and bending vibration is generated in the piezoelectric element P1. Due to the vibration of the piezoelectric element P1, the driver elements 8 make an orbit movement according to the piezoelectric element P1.

<1.4: Equivalent Circuit of Ultrasonic Actuator>

Figure 6:
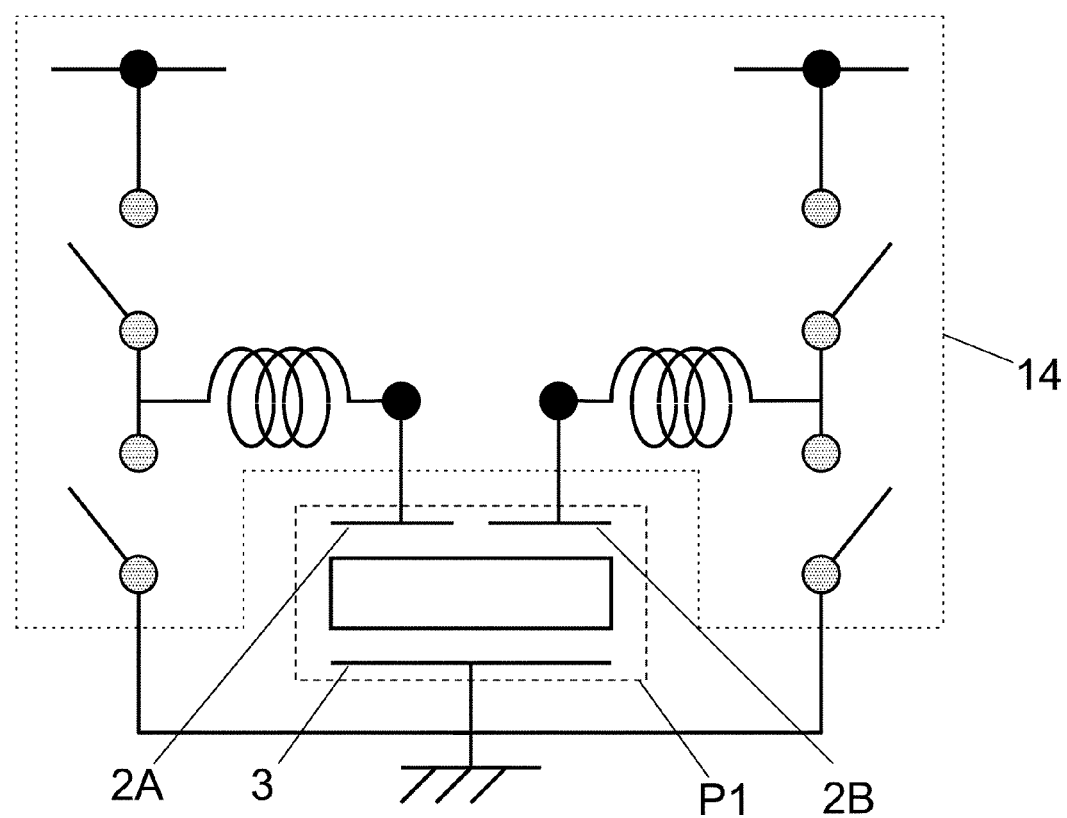
FIG. 6 is a circuit diagram of the ultrasonic actuator and a drive power supply.

FIG. 6 is a circuit diagram of the ultrasonic actuator and the drive power supply 14. The drive power supply 14 includes two half bridges and two coils. The half bridges output a rectangular voltage which has a voltage value equal to the supply voltage. The piezoelectric element P1 is connected in series between the coils and the half bridges. The capacitance of the piezoelectric element P1 and the inductance of the coils form a low pass filter. A sinusoidal driving voltage is applied to the piezoelectric element P1.

The drive power supply 14 applies sinusoidal driving voltages of different phases to the piezoelectric element P1 by the two half bridges and the two coils. Specifically, a first sinusoidal driving voltage is generated by the first half bridge and the first coil. The first sinusoidal driving voltage is applied between the first power supply electrode 2A and the counter electrode 3 of the piezoelectric element P1. A second sinusoidal driving voltage is generated by the second half bridge and the second coil. The second sinusoidal driving voltage is equal in frequency and amplitude to, but different in phase from, the first sinusoidal driving voltage. The second sinusoidal driving voltage is applied between the second power supply electrode 2B and the counter electrode 3 of the piezoelectric element P1.

The drive power supply 14 can change the frequency of the first sinusoidal driving voltage and the frequency of the second sinusoidal driving voltage within a predetermined range by changing the gate signals of the half bridges. The drive power supply 14 can also change the phase difference between the first sinusoidal driving voltage and the second sinusoidal driving voltage by changing the gate signals of the half bridges.

The cutoff frequency of the low pass filter, which depends on the inductance of the coils and the capacitance of the piezoelectric element, is desirably higher than the driving frequency of the ultrasonic actuator.

Here, the description is provided with an example of the 2ch half bridges which generate the first and second driving voltages. However, the power supply circuit may be implemented using 2ch full bridges or an amplifier structure.

<<2: Operation of Ultrasonic Actuator>>
<2.1: Basic Operation>

Figure 7:
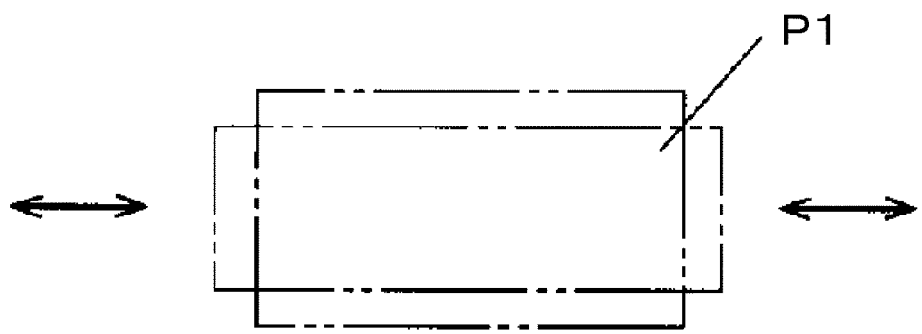
FIG. 7 is a concept diagram illustrating the displacement of the first mode stretching vibration of the ultrasonic actuator of the embodiment.
Figure 8:
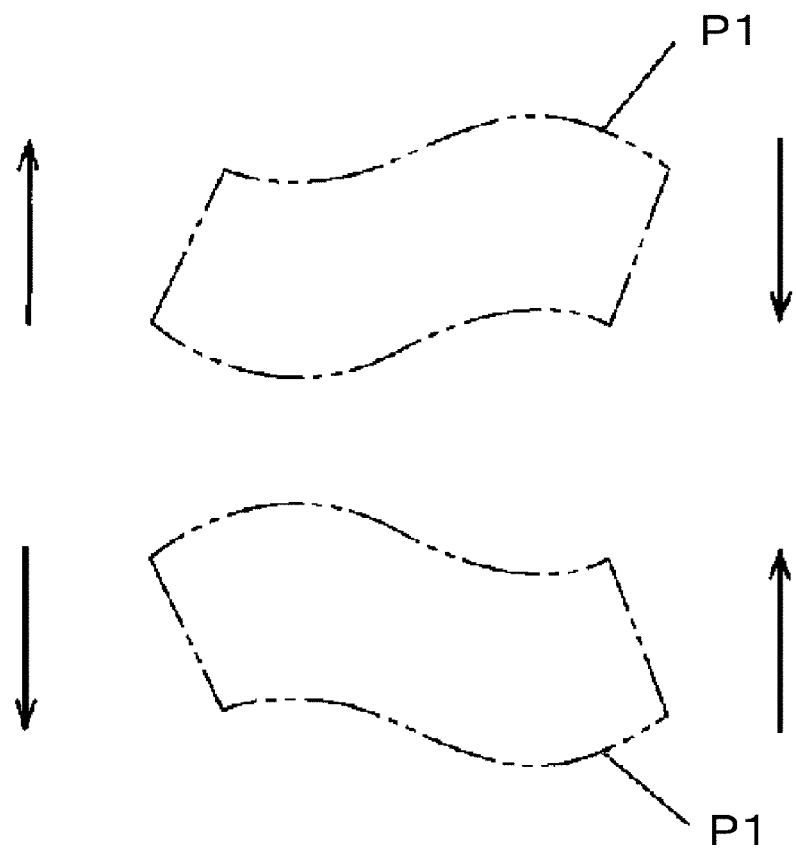
FIG. 8 is a concept diagram illustrating the displacement of the second mode bending vibration of the ultrasonic actuator of the embodiment.
Figure 9A:
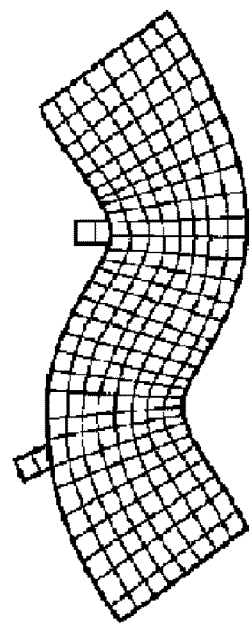
FIG. 9 is a concept diagram illustrating the operation of the ultrasonic actuator of the embodiment.
Figure 9B:
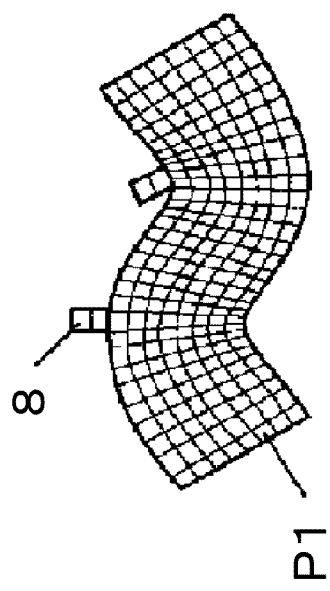
Figure 9C:
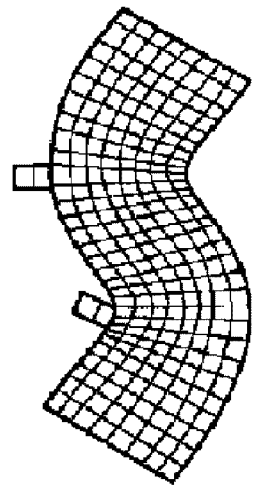
Figure 9D:
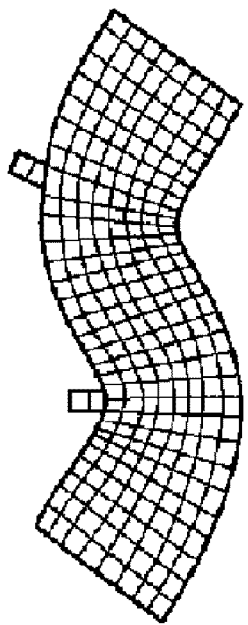

Hereinafter, an operation of the ultrasonic actuator is described. FIG. 7 is a concept diagram illustrating the displacement of the first-order stretching vibration according to this embodiment. FIG. 8 is a concept diagram illustrating the displacement of the second-order bending vibration of the ultrasonic actuator. FIG. 9 is a concept diagram illustrating the operation of the piezoelectric element P1. Note that, in FIGS. 7-9, the principal surface of the piezoelectric element P1 is parallel to the surfaces of the sheets of the drawings.

The electric lines 7 of the flexible cable F12 are coupled to the ground. The drive power supply 14 applies a sinusoidal driving voltage of a predetermined frequency, as the first driving voltage, to the first power supply electrode 2A of the principal surface of the piezoelectric layer 1 via the electric line 6A and the first power supply external electrode 4A. Also, the drive power supply 14 also applies a sinusoidal second driving voltage to the second power supply electrode 2B via the electric line 6B and the second power supply external electrode 4B. The amplitude and frequency of the second driving voltage are substantially equal to those of the first driving voltage.

When the phase difference between the first driving voltage applied to the first power supply electrode 2A and the second driving voltage applied to the second power supply electrode 2B is 0°, the first-order stretching vibration is induced in the piezoelectric element P1 as shown in FIG. 7. When the phase difference is 180°, the second-order bending vibration is induced in the piezoelectric element P1 as shown in FIG. 8.

When the phase difference between the first driving voltage applied to the first power supply electrode 2A and the second driving voltage applied to the second power supply electrode 2B is generally 90° or −90°, the first-order stretching vibration and the second-order bending vibration are harmonically induced in the piezoelectric element P1 as shown in FIG. 9. As a result, the piezoelectric element P1 vibrates with its shape being sequentially deformed in the order of FIG. 9(A), FIG. 9(B), FIG. 9(C), and FIG. 9(D). The driver elements 8 provided on the piezoelectric element P1 make an orbit movement, specifically a generally-elliptic movement, when seen in the direction perpendicular to the surface of the sheet of FIG. 9. In other words, the composite vibration of the stretching vibration and bending vibration of the piezoelectric element P1 causes the driver elements 8 to make an elliptic movement. Due to this elliptic movement, the movable element 9 on which the driver elements 8 abut moves relative to the piezoelectric element P1.

The piezoelectric element P1 is arranged such that the longitudinal direction of its principal surface is equal to the movable direction of the movable element 9, and that the lateral direction of its principal surface is equal to the direction in which the piezoelectric element P1 is biased by the supporting portion 13b toward the movable element 9. The stretching direction of the stretching vibration of the piezoelectric element P1 is equal to the movable direction of the movable element 9, and the vibration direction of the bending vibration is equal to the direction in which the driver elements 8 are pressed against the movable element 9. Note that the stacking direction of the piezoelectric element P1 is perpendicular to both the stretching direction of the stretching vibration and the vibration direction of the bending vibration. The long-side surfaces of the piezoelectric element P1 are on the planes crossing the direction of the bending vibration (i.e., the planes facing in the direction of the bending vibration).

As previously described, the direction of the stretching vibration of the piezoelectric element P1 is equal to the movable direction of the movable element 9, and therefore, a greater stretching vibration can cause the movable element 9 to move by a greater distance. This means that, if the frequencies are equal, the movable element 9 can move faster. On the other hand, the bending vibration of the piezoelectric element P1 occurs in the direction in which the driver elements 8 are pressed against the movable element 9, and therefore affect the frictional force between the movable element 9 and the driver elements 8. When the movable element 9 is moved to the right in the sheet of FIG. 1, the frictional force between the movable element 9 and the driver elements 8 is great during the shifting of the driver elements 8 to the right, but the frictional force between the movable element 9 and the driver elements 8 is small during the shifting of the driver elements 8 to the left.

Here, to relatively move the movable element 9, the frictional force between the movable element 9 and the driver elements 8 need to be equal to or greater than a predetermined value. Therefore, the frequency of the driving voltage from the drive power supply 14 need to be determined based on the resonance frequency of the bending vibration such that the frictional force between the movable element 9 and the driver elements 8 is equal to or greater than the predetermined value. The speed of movement of the movable element 9 depends on the amplitude of the stretching vibration at the frequency determined in this way.

<2.2: Resonance Frequency, Anti-Resonance Frequency>

The resonance frequency and the anti-resonance frequency of the stretching vibration and the bending vibration of the piezoelectric element P1 are now described. The resonance frequency and the anti-resonance frequency of the stretching vibration and the resonance frequency and the anti-resonance frequency of the bending vibration of the piezoelectric element P1 (vibrator) depend on the material, the exterior dimensions, the electrode shape, etc., of the piezoelectric element P1. The resonance frequency of the stretching vibration is inversely proportional to the length of the piezoelectric element P1. The resonance frequency of the bending vibration is inversely proportional to the square of the length of the piezoelectric element P1 and is proportional to the dimension of the piezoelectric element P1 in the vibration direction of the bending vibration. The difference (band) between the resonance frequency and the anti-resonance frequency depends on the area of the electrodes. Further, the resonance frequency and the anti-resonance frequency change depending on the pressing force with which the supporting portion 13b presses the driver elements 8 against the movable element 9.

The resonance frequency and the anti-resonance frequency of the stretching vibration can be measured by an impedance analyzer. Specifically, when measuring the resonance frequency and the anti-resonance frequency of the stretching vibration, voltages having the same phase are applied to the first power supply electrode and the second power supply electrode. Note that some current limiting is desirably provided because a large current flowing during measurement of resonance frequency would cause the piezoelectric element P1 to generate heat. In the frequency spectrum of the impedance of the piezoelectric element P1 during the application of the voltages, a frequency corresponding to the lowest impedance is the resonance frequency of the stretching vibration, and a frequency corresponding to the highest impedance is the anti-resonance frequency of the stretching vibration.

Likewise, the resonance frequency and the anti-resonance frequency of the bending vibration can be measured by an impedance analyzer. Specifically, when measuring the resonance frequency and the anti-resonance frequency of the bending vibration, voltages having the opposite phases are applied to the first power supply electrode and the second power supply electrode. Note that some current limiting is desirably provided because a large current flowing during measurement of resonance frequency would cause the piezoelectric element P1 to generate heat. In the frequency spectrum of the impedance of the piezoelectric element P1 during the application of the voltages, a frequency corresponding to the lowest impedance is the resonance frequency of the bending vibration, and a frequency corresponding to the highest impedance is the anti-resonance frequency of the bending vibration.

Both the resonance frequency and the anti-resonance frequency of the stretching vibration and the bending vibration depend on incoming voltage and pressure. Therefore, to correctly measure these frequencies, it is preferable to measure the current value while changing the frequencies with the ultrasonic actuator being driven (with the ultrasonic actuator being incorporated as a driver, i.e., in this embodiment, with the driver elements 8 being pressed against the movable element 9) and the voltages for measurement being equal to the voltages for driving.

The resonance frequency of the stretching vibration is classified with the ordinal numbers attached in the ascending order from the lowest frequency, i.e., the first-order stretching vibration resonance frequency, the second-order stretching vibration resonance frequency, the third-order stretching vibration resonance frequency, and the fourth-order stretching vibration resonance frequency. Likewise, the anti-resonance frequency of the stretching vibration and the resonance frequency and the anti-resonance frequency of the bending vibration are classified with the ordinal numbers attached in the ascending order from the lowest frequency, i.e., first-order, second-order, . . . .

This embodiment uses, as described above, the first-order stretching vibration as the stretching vibration and the second-order bending vibration as the bending vibration. In other words, the piezoelectric element P1 undergoes vibration including the first-order stretching vibration and the second-order bending vibration. Hereinafter, in this specification, when frequencies are simply referred to as the resonance frequency and the anti-resonance frequency of the stretching vibration or the resonance frequency and the anti-resonance frequency of the bending vibration, the frequencies are in the same modes as those of the resonance frequency and the anti-resonance frequency of the stretching vibration or the resonance frequency and the anti-resonance frequency of the bending vibration of the piezoelectric element P1 when it is driven.

Figure 10:
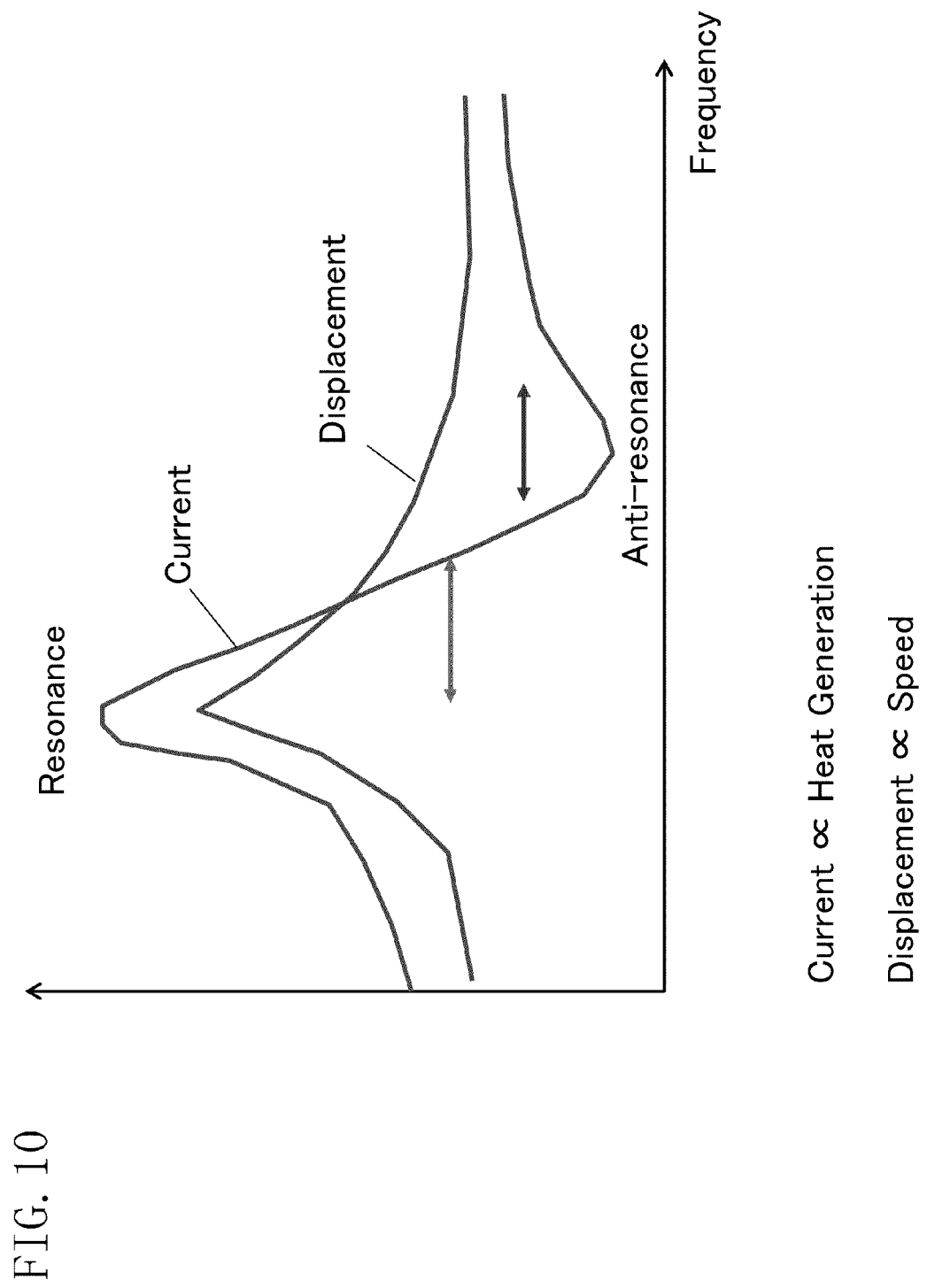
FIG. 10 shows the frequency characteristics of the vibration amplitude of the first-order stretching vibration and the impedance of the piezoelectric element.

FIG. 10 shows the frequency characteristic of the vibration amplitude (displacement) of the first-order stretching vibration and the frequency characteristic of the impedance of the piezoelectric element P1 (in FIG. 10, the current value which is in correlation with the impedance is shown). When the input voltage is constant, the current flowing through the piezoelectric element P1 reaches the local maximum at the resonance frequency, and the displacement also reaches the local maximum. On the other hand, at the anti-resonance frequency, the current flowing through the piezoelectric element P1 reaches the local minimum. The displacement at the anti-resonance frequency is smaller than that at the resonance frequency but is not the local minimum. Near the resonance frequency, the displacement sharply changes as the frequency changes. However, the change of the displacement becomes more moderate as it leaves away from the resonance frequency.

Figure 11:
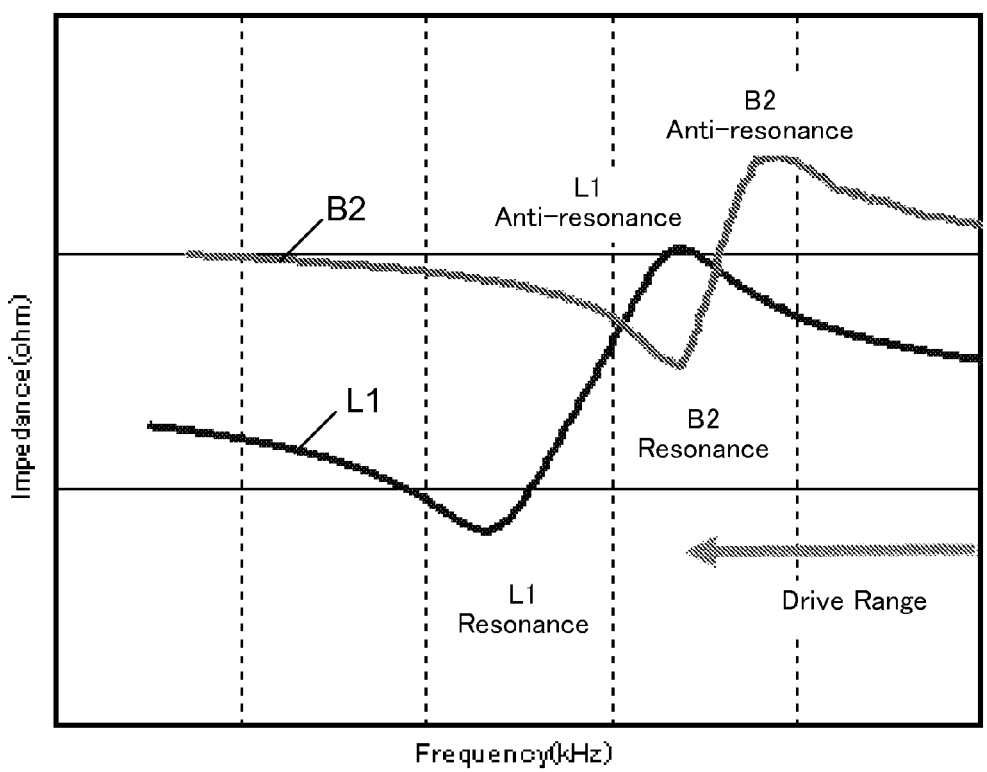
FIG. 11 shows the relationship between frequency and impedance in the first-order stretching vibration and the second-order bending vibration of the piezoelectric element.

FIG. 11 shows the relationship between frequency and impedance as to the first-order stretching vibration and the second-order bending vibration of the piezoelectric element P1 of this embodiment. The first-order stretching vibration (L1 in the chart) has a large difference (band) between the resonance frequency and the anti-resonance frequency. This is because the vibration mode of the stretching vibration is a simple vibration which is accompanied by expansion and contraction of the piezoelectric element P1 in the longitudinal direction, i.e., the long-side direction of the principal surface. This applies to the stretching vibration in general, and applies in particular to the first-order stretching vibration. On the other hand, the second-order bending vibration (B2 in the chart) is accompanied by bending deformation of the piezoelectric element P1 and is therefore unlikely to occur as compared with the first-order stretching vibration, and the difference (band) between the resonance frequency and the anti-resonance frequency is smaller than that of the first-order stretching vibration. This applies to the bending vibration in general. Thus, the second-order bending vibration is difficult to occur as compared with the first-order stretching vibration. This applies in particular to the case where the shape of the piezoelectric element P1 is a rectangular parallelepiped, and the direction of the bending vibration is substantially parallel to the principal surfaces of the piezoelectric element P1 that are the largest among its outer surfaces. That is, the bending vibration easily occurs, the band between the resonance frequency and the anti-resonance frequency is narrower, and the impedance of the piezoelectric element P1 at the resonance frequency is greater when the direction of the bending vibration is substantially parallel to the principal surfaces of the piezoelectric element P1 that are the largest among its outer surfaces than when the direction of the bending vibration crosses the principal surfaces of the piezoelectric element P1 that are the largest among its outer surfaces.

The impedance at the resonance frequency of the first-order stretching vibration of the piezoelectric element P1 is lower than the impedance at the resonance frequency of the second-order bending vibration of the piezoelectric element P1. Here, the impedance of the piezoelectric element P1 specifically refers to the total impedance of the entire piezoelectric layer 1 sandwiched between the power supply electrodes and the counter electrodes. The measurement of the impedance can be accomplished by measuring the impedance between the power supply external electrodes 4 and the counter external electrodes 5.

In this embodiment, the exterior dimensions of the piezoelectric element P1 are configured such that, when the driver elements 8 is pressed against the movable element 9, the difference between the resonance frequency of the second-order bending vibration of the piezoelectric element P1 and the anti-resonance frequency of the first-order stretching vibration of the piezoelectric element P1 is smaller than the different between the resonance frequency of the second-order bending vibration of the piezoelectric element P1 and the resonance frequency of the first-order stretching vibration of the piezoelectric element P1. This configuration makes the movable element 9 drivable and prevents generation of heat in the piezoelectric element P1. Preferably, the anti-resonance frequency of the first-order stretching vibration of the piezoelectric element P1 is substantially equal to the resonance frequency of the second-order bending vibration when the driver elements 8 is pressed against the movable element 9. The phrase "substantially equal" means such a degree of equality that the extents of variations of the resonance frequency and the anti-resonance frequency, e.g., among manufactured articles, are overlapping.

Thus, as described above, the resonance of the bending vibration is small as compared with the stretching vibration. Therefore, a frequency at which the movable element 9 can substantially be driven is limited to a predetermined range which includes the resonance frequency of the bending vibration. In other words, to set the frictional force between the movable element 9 and the driver elements 8 equal to or greater than a predetermined value for the purpose of moving the movable element 9, the piezoelectric element P1 need to be driven at a frequency in the predetermined range which includes the resonance frequency of the bending vibration.

On the other hand, as for the stretching vibration, in the context of rapid movement of the movable element 9, the piezoelectric element P1 is preferably energized in the range which includes the resonance frequency of the stretching vibration. However, when a driving voltage at the resonance frequency is applied to the piezoelectric element P1, a large current flows through the piezoelectric element P1 so that the amount of heat generated therein disadvantageously increases.

In view of such circumstances, this embodiment is configured such that the difference between the resonance frequency of the bending vibration of the piezoelectric element P1 and the anti-resonance frequency of the stretching vibration of the piezoelectric element P1 is smaller than the difference between the resonance frequency of the bending vibration of the piezoelectric element P1 and the resonance frequency of the stretching vibration of the piezoelectric element P1. This configuration results in that the resonance frequency of the bending vibration is near the anti-resonance frequency of the stretching vibration. Therefore, when a driving voltage at a frequency which is within a predetermined frequency range including the resonance frequency of the bending vibration is applied to the piezoelectric element P1 in order to generate a sufficient frictional force between the driver elements 8 and the movable element 9, the probability of a large current flowing through the piezoelectric element P1 decreases because the impedance of the piezoelectric element P1 is high. Thus, generation of heat in the piezoelectric element P1 can be reduced.

As shown in FIG. 10, in a frequency range around the anti-resonance frequency, the amount of change in displacement relative to the change in frequency is smaller. In other words, the frequency dependence of the stretching vibration is small, and therefore, stable control can be accomplished.

However, with the voltage being constant, the displacement near the anti-resonance frequency of the stretching vibration is smaller than the displacement near the resonance frequency of the stretching vibration. To achieve a displacement which is generally as large as that achieved by driving at a frequency near the resonance frequency even at a frequency near the anti-resonance frequency of the stretching vibration, applying a driving voltage of a high voltage value, or configuring the layered structure of the piezoelectric element P1 as in this embodiment and providing a thinner piezoelectric layer therein so that the field intensity is increased, is preferably adopted.

<2.3: Speed Control>

As shown in FIG. 10, the displacement of the piezoelectric element P1, i.e., the speed, monotonically decreases in a frequency range higher than the anti-resonance frequency of the stretching vibration. Therefore, stable driving control can be accomplished by setting the frequency of the driving voltage (driving frequency) higher than the anti-resonance frequency of the stretching vibration. The speed and frictional force monotonically decrease relative to the frequency when the frequency of the driving voltage is set in a frequency range higher than the anti-resonance frequency of the stretching vibration and than the resonance frequency of the bending vibration. Thus, more stable driving control can be accomplished. Further, by setting the frequency of the driving voltage between the anti-resonance frequency of the stretching vibration and the resonance frequency of the bending vibration, driving control can be accomplished with high efficiency.

Note that the speed control can be accomplished by voltage control or by setting the phase difference between the voltages applied to the first power supply electrode and the second power supply electrode to a value different from 90° as well as by raising and lowering the frequency. In any case, the speed of the driver elements is stable over the frequency by setting the frequency of the driving voltage (driving frequency) higher than the anti-resonance frequency of the stretching vibration. Therefore, the speed is stable even when the resonance frequency of the ultrasonic actuator or the frequency of the supply voltage varies.

Advantages of Embodiment

The difference between the resonance frequency of the bending vibration of the piezoelectric element P1 and the anti-resonance frequency of the stretching vibration of the piezoelectric element P1 is smaller than the difference between the resonance frequency of the bending vibration of the piezoelectric element P1 and the resonance frequency of the stretching vibration of the piezoelectric element P1. Therefore, when the piezoelectric element P1 is operated in a predetermined frequency range which includes the resonance frequency of the bending vibration in order to drive the movable element 9, the impedance of the piezoelectric element P1 is high. Thus, flowing of a large current through the vibrator (the piezoelectric element P1) can be reduced, and generation of heat in the vibrator (the piezoelectric element P1) can be reduced. In other words, generation of heat in the piezoelectric element P1 can be prevented while the movable element 9 is drivable.

The resonance frequency of the bending vibration of the vibrator (the piezoelectric element P1) is substantially equal to the anti-resonance frequency of the stretching vibration of the vibrator (the piezoelectric element P1). Therefore, when the piezoelectric element P1 operated at a frequency near the resonance frequency of the bending vibration, the piezoelectric element P1 is operated near the anti-resonance frequency of the stretching vibration. In this case, the impedance of the piezoelectric element P1 is high, so that a current scarcely flows through the piezoelectric element P1, and therefore, generation of heat in the piezoelectric element P1 can be reduced. Since the amplitude of the bending vibration is increased by operating the piezoelectric element P1 at a frequency near the resonance frequency of the bending vibration, a sufficient frictional force can be generated between the driver elements 8 and the movable element 9.

The frequency of the driving voltage is higher than the resonance frequency of the stretching vibration of the vibrator (the piezoelectric element P1). This prevents the piezoelectric element P1 from being actuated at a frequency equal to the resonance frequency of the stretching vibration. Thus, a large current does not flow through the vibrator (the piezoelectric element P1), and therefore, generation of heat in the piezoelectric element P1 can be reduced.

The frequency of the driving voltage is equal to or higher than the anti-resonance frequency of the stretching vibration of the vibrator (the piezoelectric element P1). In a frequency range equal to or higher than the anti-resonance frequency of the stretching vibration, the change in speed relative to the change in frequency is a monotonic decrease, and therefore, stable control can be accomplished.

The frequency of the driving voltage is equal to or higher than the resonance frequency of the bending vibration of the vibrator. Therefore, in a frequency range equal to or higher than the resonance frequency of the bending vibration, the change in speed relative to the change in frequency is a monotonic decrease, and therefore, stable control can be accomplished.

In the above-described embodiment, the short-side surfaces of the piezoelectric element P1 are far away from a stress-concentrated part of the first-order stretching vibration and therefore create only a small stress. Since the lateral surfaces are free ends of the piezoelectric element, only a small stress is created even in the case of the second-order bending vibration. In this embodiment, the flexible cables (electrical connection members) are connected to the lateral surfaces. Therefore, the stress created in the connection faces by vibration of the piezoelectric element is reduced. Thus, occurrence of peeling at the connection faces between the piezoelectric element and the electrical connection members can be prevented.

In the above-described embodiment, when seen in a direction perpendicular to the principal surface of the piezoelectric element, an area of the power supply electrodes 2 and an area of the counter electrode 3 are not overlapping in regions near the short sides of the principal surface of the piezoelectric layer 1. In other words, part of the piezoelectric layer 1 near the short sides of its principal surface is piezoelectrically inactive. Due to this configuration, in the part of the piezoelectric layer 1 near the short sides of its principal surface, i.e., in the lateral surfaces at which the electrical connection members are connected, occurrence of strain due to electrostrictive effect is prevented. Occurrence of stress in the connection faces due to the vibration of the piezoelectric element can be reduced. Thus, occurrence of peeling at the connection faces can be prevented. When the piezoelectric element and the electrical connection members are connected by heating, such heating can result in reduced polarization from a part of the piezoelectric element near the lateral surfaces. Collapse of the balance of polarization near the two lateral surfaces leads to collapse of the vibration balance. However, the part of the piezoelectric element near the lateral surfaces is piezoelectrically inactive due to the above-described configuration and is therefore not affected by polarization, so that the vibration balance does not collapse. Examples of the thermal connection of the piezoelectric element and the electrical connection members by heating include connection with an anisotropic conductive adhesive sheet as in the above-described embodiment, a conductive adhesive, a low-melting metal, etc.

The electrical connection members include the first electrical connection member and the second electrical connection member. The first electrical connection member is electrically connected to the piezoelectric element P1 at one of the two lateral surfaces which are perpendicular to the principal surface of the piezoelectric layer 1 and which are parallel to the short sides of the principal surface. The second electrical connection member is electrically connected to the piezoelectric element P1 at the other one of the two lateral surfaces. The shape of the first electrical connection member is symmetrical about a plane which passes through the midpoints of the short sides of the principal surface of the piezoelectric layer 1 and which is perpendicular to the one of the two lateral surfaces. The shape of the second electrical connection member is symmetrical about a plane which passes through the midpoints of the short sides of the principal surface of the piezoelectric layer 1 and which is perpendicular to the other one of the two lateral surfaces. This configuration improves the vibration balance of the piezoelectric element.

The first power supply external electrode 4A and the counter external electrodes 5 are provided at different surfaces. The second power supply external electrode 4B and the counter external electrodes 5 are provided at different surfaces. This configuration ensures a sufficient distance between the first power supply external electrode 4A and the counter external electrodes 5 and between the second power supply external electrode 4B and the counter external electrodes 5. Accordingly, sufficient insulation can be ensured between the first power supply external electrode 4A and the counter external electrodes 5 and between the second power supply external electrode 4B and the counter external electrodes 5.

The principal surface of the piezoelectric layer 1 on which the first power supply electrode is provided has the first connection electrode J1 which provides electrical connection between the first power supply electrodes 2A. The principal surface of another piezoelectric layer 1, which is different from the principal surface that has the first connection electrode J1 thereon, has the second connection electrode J2 which provides electrical connection between the second power supply electrodes 2B. This configuration enables reduction of the number of the first power supply external electrodes 4A which are electrically coupled to the first power supply electrodes 2A and the number of the second power supply external electrodes 4B which are electrically coupled to the second power supply electrode 2B.

The first connection electrode J1 and the second connection electrode J2 are provided at the longitudinal center of the principal surface of the piezoelectric layer 1 and are shaped so as to extend generally in parallel to the short sides of the principal surface of the piezoelectric layer 1. This enables the power supply electrodes 2 provided at the longitudinal center of the piezoelectric layer 1 to have a larger area. Here, the longitudinal center of the piezoelectric layer 1 is the node of the first mode stretching vibration, i.e., a stress-concentrated part at which the stress caused by the stretching vibration concentrates. In this stress-concentrated part, electric charge concentrates due to the piezoelectric effect. As previously described, the electrode of the concerned part is designed so as to have a large area, so that large stretching vibration can be induced even with a smaller piezoelectric element. As a result, the efficiency of the ultrasonic actuator can be improved.

The first electrical connection member is shaped symmetrical about a plane which passes through the midpoints of the short sides of the principal surface of the piezoelectric layer 1 and which is perpendicular to one of the short-side surfaces. The second electrical connection member is shaped symmetrical about a plane which passes through the midpoints of the short sides of the principal surface of the piezoelectric layer 1 and which is perpendicular to the other one of the short-side surfaces. In this configuration, the influence of the connection of the electrical connection members on vibration is symmetrical about a plane which passes through the midpoints of the short sides of the principal surface of the piezoelectric layer 1 and which is perpendicular to the short-side surfaces. The influence of the connection of the electrical connection members on the symmetry of vibration can be reduced.

The first electrical connection member and the second electrical connection member are shaped symmetrical about a plane which passes through the midpoints of the long sides of the principal surface of the piezoelectric layer 1 and which is perpendicular to the principal surface. In this configuration, the influence of the connection of the electrical connection members on vibration is symmetrical about a plane which passes through the midpoints of the long sides of the principal surface of the piezoelectric layer 1 and which is perpendicular to the principal surface. The influence of the connection of the electrical connection members on the symmetry of vibration can be reduced.

The driver elements 8 and the piezoelectric element P1 are fixedly in point contact with each other, so that interference with the bending vibration of the piezoelectric element is reduced, and the efficiency of the bending vibration is improved. Note that the driver elements and the piezoelectric element may be fixedly in point contact with each other.

The surfaces of the piezoelectric element on which the electrical connection members are connected are substantially flat even in the first mode stretching vibration and the second mode bending vibration. Stress is unlikely to occur in the planes of the electrical connection members, and stable connection can be expected.

Other Embodiments

According to the present invention, the above-described embodiments may have different structures which are described below.

The shape of the driver elements 8 is not limited to the shape of a circular pole. It may be the shape of a sphere or a square pole. The driver elements preferably have a spherical shape because in this case the driver elements and the piezoelectric element P1 are fixedly in point contact with each other.

The electrical connection members are not limited to the flexible cables. For example, wires, contact pins, conductive rubbers, etc., may be used. The above-described connection with the anisotropic conductive adhesive sheet may be replaced by a different electrical connection method, for example, connection with a low-melting metal, such as soldering, connection by wire bonding, connection with a non-anisotropic conductive adhesive sheet, connection with a conductive adhesive, such as a liquid adhesive, connection by pressing, etc. The conductive rubbers may have a layered structure which includes a supporting layer made of, for example, silicone rubber as a principal constituent, and a conductive layer containing silicone rubber and metal particles of silver, or the like, and may be anisotropic so that it is nonconducting in the stacking direction. One of the lateral surfaces of the piezoelectric element may be provided with one piece of the conductive rubber or may be provided with two pieces of the conductive rubber. In the case of using the conductive rubber, the conductive rubber may be used as the supporting portions 13a and 13c. In the case where one of the lateral surfaces of the piezoelectric element is provided with one piece of the conductive rubber, the non-conductive property of the conductive rubber in the stacking direction is utilized to provide insulation of the power supply external electrodes 4 and the counter external electrodes 5, specifically insulation between the first power supply external electrode 4A and the second power supply external electrode 4B, and insulation between a first counter external electrode 5A and a second counter external electrode 5B. In this case, the respective conductive layers function as any of the first power supply conductive member 6A, the second power supply conductive member 6B, and the counter conductive member 7.

The first connection electrode J1 and the second connection electrode J2 are provided at the longitudinal center of the principal surface of the piezoelectric layer 1 and have a shape elongated in a direction generally parallel to the short sides of the principal surface of the piezoelectric layer 1. More preferably, as for the dimensions in the direction of the long sides of the piezoelectric layer 1, the width of the first connection electrode J1 and the second connection electrode J2 is preferably about 5% to 40% of the length of the long sides of the piezoelectric layer 1. This is because, although a greater stretching vibration occurs as the electrode areas of the first connection electrode J1 and the second connection electrode J2 increase, the second mode bending vibration would be interrupted if the electrode areas are excessively large. On the other hand, as for the dimensions in the direction of the short sides of the piezoelectric layer 1, the first connection electrode J1 and the second connection electrode J2 should ideally be provided over the entire short sides. However, if the first connection electrode J1 and the second connection electrode J2 reach the edges of the piezoelectric layer 1 at its lateral ends, it is difficult to provide insulation between the internal electrode layers. As such, the first connection electrode J1 and the second connection electrode J2 are preferably provided over the principal surface of the piezoelectric layer 1 except for the edges of the principal surface at its lateral ends. Specifically, the first connection electrode J1 and the second connection electrode J2 are desirably provided over the entire principal surface of the piezoelectric layer 1 except for a region extending from the respective edges of the principal surface of the piezoelectric layer 1 at its lateral ends toward the lateral center by the distance equal to the thickness of the piezoelectric layer 1.

The number of power supply electrodes 2 of the first pattern and the number of power supply electrodes 2 of the second pattern are preferably equal although they may not be equal. The power supply electrodes 2 of the first pattern and the power supply electrodes 2 of the second pattern are preferably alternately provided although they may not be alternately provided. This alternate arrangement improves the symmetry of vibration of the piezoelectric element. Also, the alternate arrangement prevents generation of excessive vibration in the piezoelectric element so that the energy loss can be greatly reduced.

The electrodes are preferably not provided on the principal surface of the piezoelectric element P1, although they may be provided thereon. In this case, no electrode is provided on the principal surface which has a larger area among the outer surfaces of the piezoelectric element. Therefore, the probability of occurrence of short circuits which would occur when the electrodes come in contact with peripheral metal parts decreases.

Figure 12:
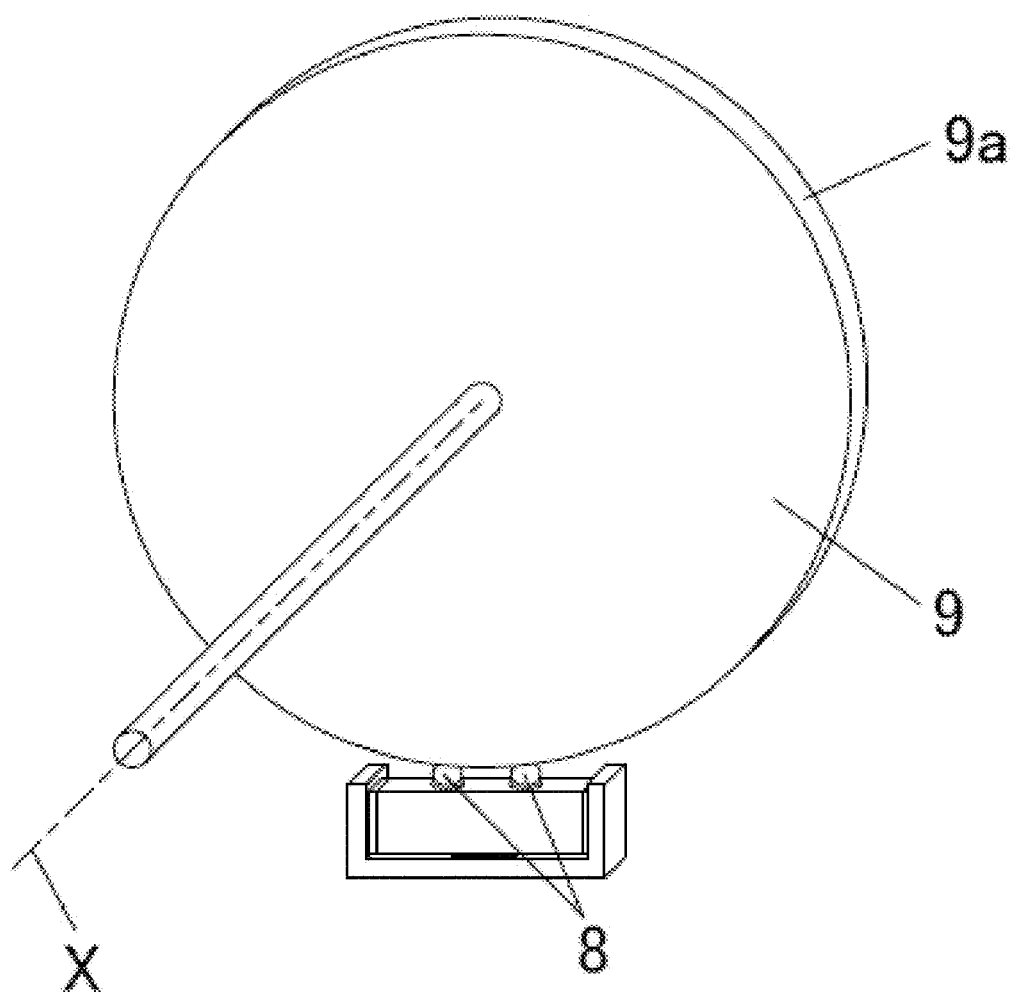
FIG. 12 shows another ultrasonic actuator embodiment.

In the above-described embodiments, the movable element 9 which is driven by applying a driving force from the ultrasonic actuator is in the shape of a flat plate, to which the present invention is not limited. Any structure may be adopted as the structure of the movable element 9. For example, as shown in FIG. 12, the movable element may be a circular disk 9 which is rotatable around a predetermined axis X, with the driver elements 8 of the ultrasonic actuator abutting the circumferential surface 9a of the circular disk 9. In the case of this structure, when the ultrasonic actuator is energized, the driver elements 8 make a generally-elliptic movement, and accordingly, the circular disk 9 is rotated around the predetermined axis X. Part of the mechanism including the piezoelectric element may be stationary or may be movable.

In the above-described embodiments, the supporting body is formed by the case 11 but may be formed by any structure.

The region where the power supply electrodes 2 and the counter electrode 3 are not overlapping when seen in the stacking direction is preferably a region extending from the respective edges of the piezoelectric layer 1 at its longitudinal ends toward the longitudinal center by the distance equal to or greater than 10% of the longitudinal dimension of the piezoelectric layer 1. The region where the power supply electrodes 2 and the counter electrode 3 are not overlapping when seen in the stacking direction is more preferably a region extending from the respective edges of the piezoelectric layer 1 at its longitudinal ends toward the longitudinal center by the distance equal to or greater than 20% of the longitudinal dimension of the piezoelectric layer 1. In this case, near the edges of the piezoelectric layer 1 at its longitudinal ends, only a small stress is created under the first mode stretching vibration. Also, the connection between the lateral surfaces of the piezoelectric element and the electrical connection members can be less affected.

In the above-described embodiments, the voltage applied to the second power supply electrode 2B is different in phase from the voltage applied to the first power supply electrode 2A by generally +90 degrees or by generally −90 degrees. However, the present invention is not limited to this example and can include different phase differences. Also, the voltage may be selectively applied to only one of the first power supply electrode 2A and the second power supply electrode 2B.

Figure 13:
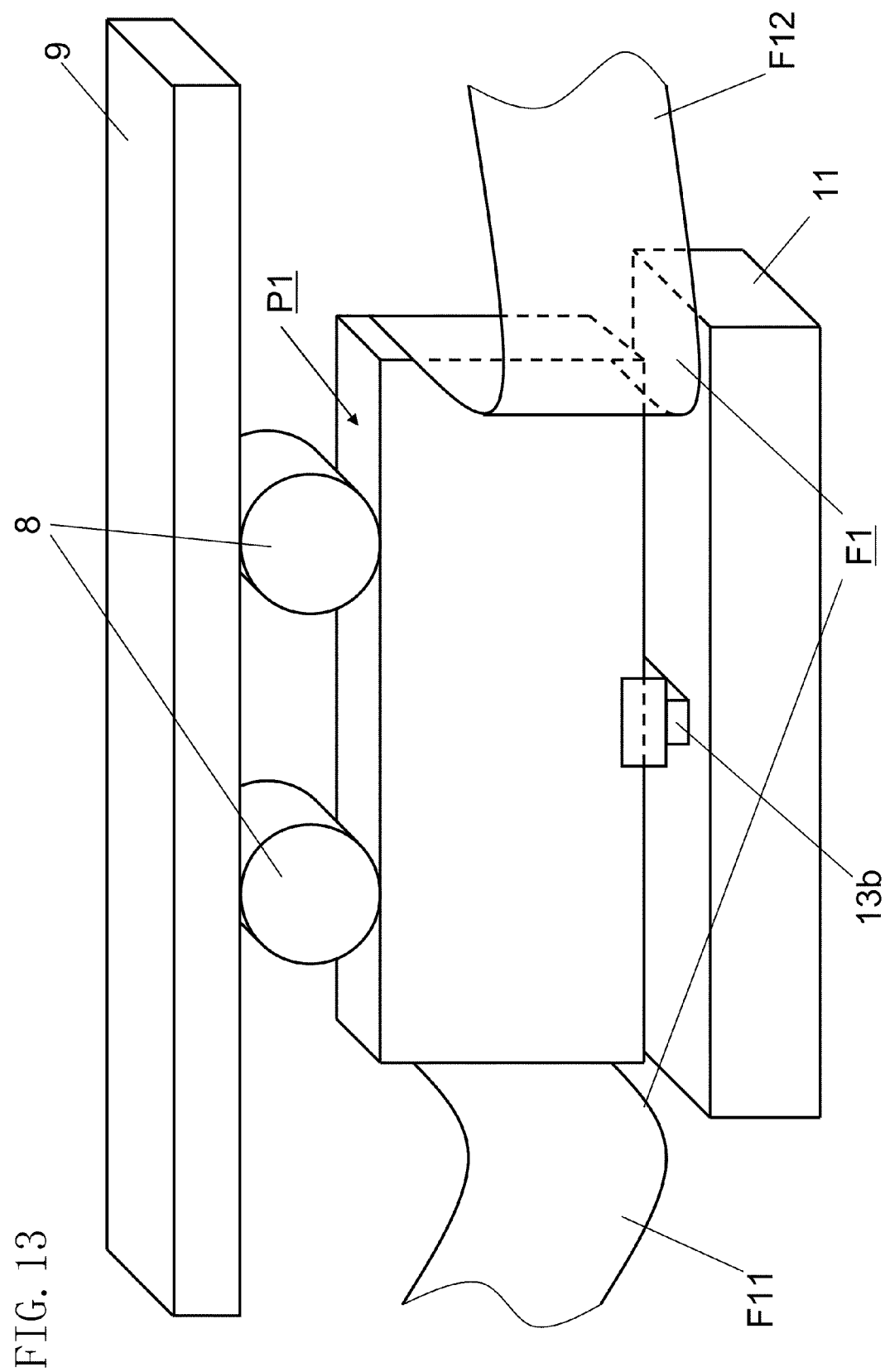
FIG. 13 shows still another ultrasonic actuator embodiment.

In the above-described embodiments, the ultrasonic actuator is supported using the supporting portions 13a, 13b and 13c. However, the present invention is not limited to this example. For example, as shown in FIG. 13, only the supporting portion 13b is provided at one of the two end faces of the piezoelectric element on which the driver elements are not provided. This supporting portion 13b restricts the movement of the piezoelectric element P1 in the driving direction (the long-side direction of the principal surface) and allows the movement of the driver elements 8 in a direction in which the driver elements 8 abut the movable element 9 (the short-side direction of the principal surface). The supporting portion 13b generates a pressing force in a direction in which the driver elements 8 abut the movable element 9 and increases the frictional force between the driver elements 8 and the movable element 9.

In the above-described embodiments, the piezoelectric element P1 itself, which includes the piezoelectric layers, harmonically generates the stretching vibration and the bending vibration. The same effect can be achieved even in a structure where a piezoelectric body or the piezoelectric element P1 is adhered over a substrate of a metal, or the like, or in a structure where a resonator formed of a metal, or the like, which sandwiches a piezoelectric body or the piezoelectric element P1. In this case, the resonator configured so as to include the piezoelectric body constitutes the actuator body, and the resonator is held in the case with a compressive force being applied to the resonator in advance.

In the above-described embodiments, the driver elements 8 are fixed to the long-side surfaces of the piezoelectric element P1. However, the driver elements 8 may be fixed to the short-side surfaces.

In the above-described embodiments, the stretching vibration is the first mode, and the bending vibration is the second mode. However, different modes of resonant vibration may be employed.

The above-described embodiments are examples which are essentially preferable and do not intend to limit the present invention or its applications and uses. The embodiments are merely exemplary in all aspects and are not to be construed as limiting. The scope of the invention is defined only by claims and is not restricted by the specification. Variations and modifications equivalent to the claimed inventions are all within the scope of the present invention.

INDUSTRIAL APPLICABILITY

As described above, the present invention is useful for a highly-reliable ultrasonic actuator, for example, a driving force generator which is for use in a variety of electronic devices and other types of devices.

What is claimed is:

1. A drive unit, comprising:
a vibrator having a piezoelectric body;
a drive power supply configured to apply a driving voltage at a predetermined frequency to the vibrator such that vibration including stretching vibration and bending vibration is generated in the vibrator;
a relatively movable element which is movable relative to the vibrator according to the vibration of the vibrator; and
a driver element fixed to one of the outer surfaces of the vibrator which is crossing the direction of the bending vibration,
wherein the vibrator drives the relatively movable element in a direction of the stretching vibration, and
a difference between a resonance frequency of the bending vibration of the vibrator and an anti-resonance frequency of the stretching vibration of the vibrator is smaller than a difference between the resonance frequency of the bending vibration of the vibrator and a resonance frequency of the stretching vibration of the vibrator.

2. The drive unit of claim 1, wherein
the resonance frequency of the bending vibration of the vibrator is substantially equal to the anti-resonance frequency of the stretching vibration of the vibrator.

3. The drive unit of claim 1, wherein
a frequency of the driving voltage from the drive power supply is variable within a predetermined range.

4. The drive unit of claim 1, wherein
the frequency of the driving voltage is higher than the resonance frequency of the stretching vibration of the vibrator.

5. The drive unit of claim 1, wherein
the frequency of the driving voltage is equal to or higher than the anti-resonance frequency of the stretching vibration of the vibrator.

6. The drive unit of claim 1, wherein
the frequency of the driving voltage is equal to or higher than the resonance frequency of the bending vibration of the vibrator.

7. The drive unit of claim 1, wherein
the difference between the resonance frequency and the anti-resonance frequency of the stretching vibration of the vibrator is greater than the difference between the resonance frequency and an anti-resonance frequency of the bending vibration of the vibrator.

8. The drive unit of claim 1, wherein
the stretching vibration of the vibrator is first-order stretching vibration.

9. The drive unit of claim 8, wherein
the bending vibration of the vibrator is second-order bending vibration.

10. The drive unit of claim 1, wherein the vibrator includes
a plurality of generally-rectangular piezoelectric layers,
a power supply electrode provided on a principal surface of at least one of the plurality of piezoelectric layers, and
a counter electrode configured to face the power supply electrode with the piezoelectric layers interposed therebetween.

11. The drive unit of claim 10, wherein the power supply electrode includes
a first power supply electrode provided on the principal surface of the at least one of the plurality of piezoelectric layers, and
a second power supply electrode provided on the principal surface of the piezoelectric layer on which the first power supply electrode is provided or on a principal surface of a piezoelectric layer different from the piezoelectric layer on which the first power supply electrode is provided, the second power supply electrode being electrically separate from the first power supply electrode.

12. The drive unit of claim 11, wherein
the first power supply electrode is provided on two of four divisional regions of the principal surface of the piezoelectric layer which are defined by halving the principal surface with respect to its longitudinal and lateral directions, respectively, the two divisional regions being adjacent in a first diagonal direction of the principal surface of the piezoelectric layer, and
the second power supply electrode is provided on the other two of the four divisional regions of the principal surface of the piezoelectric layer which are defined by halving the principal surface with respect to its longitudinal and lateral directions, respectively, the other two divisional regions being adjacent in a second diagonal direction of the principal surface of the piezoelectric layer.

13. The drive unit of claim 12, wherein
the drive power supply applies a first driving voltage between the first power supply electrode and the counter electrode and applies a second driving voltage between the second power supply electrode and the counter electrode, the second driving voltage being equal in frequency to and different in phase from the first driving voltage.

14. The drive unit of claim 12, wherein
the drive power supply selectively applies the driving voltage between the first power supply electrode and the counter electrode and between the second power supply electrode and the counter electrode.

15. The drive unit of claim 1, wherein
an impedance of the piezoelectric body at the resonance frequency of the stretching vibration of the vibrator is lower than an impedance of the piezoelectric body at the resonance frequency of the bending vibration of the vibrator.

16. The drive unit of claim 1, wherein
the vibrator is in the shape of a generally rectangular parallelepiped; and
the direction of the stretching vibration is substantially equal to a long-side direction of a largest one of outer surfaces of the vibrator.

17. The drive unit of claim 1, further comprising a driver element fixed to an antinode of the bending vibration of the vibrator.

* * * * *